United States Patent [19]

Akaiwa

[11] Patent Number: 4,776,039
[45] Date of Patent: Oct. 4, 1988

[54] RECEIVER FOR MOBILE COMMUNICATION SYSTEMS

[75] Inventor: Yoshihiko Akaiwa, Tokyo, Japan

[73] Assignee: NEC Corporation, Tokyo, Japan

[21] Appl. No.: 822,553

[22] Filed: Jan. 27, 1986

[30] Foreign Application Priority Data

Jan. 25, 1986 [JP] Japan ................................ 60-10972

[51] Int. Cl.4 ............................................. H04B 1/10
[52] U.S. Cl. .................................. 455/205; 455/207; 455/209; 455/302
[58] Field of Search ......................... 455/205, 207–209, 455/302, 260, 315–317; 375/77, 97; 329/124

[56] References Cited

U.S. PATENT DOCUMENTS

| 3,568,067 | 3/1971 | Williford | 329/124 |
| 4,344,178 | 8/1982 | Waters | 329/124 |
| 4,470,145 | 9/1984 | Williams | 375/77 |

FOREIGN PATENT DOCUMENTS 1530602 11/1978 United Kingdom .

Primary Examiner—Michael A. Masinick
Attorney, Agent, or Firm—Sughrue, Mion, Zinn, Macpeak & Seas

[57] ABSTRACT

A receiver suitable for use at very high frequency bands in which an antenna output is filtered, amplified and then mixed with a local oscillator in a frequency convertor to provide an intermediate frequency. The intermediate frequency is provided to a quadrature detector which directly converts the intermediate frequency into two baseband signals whose phases differ by 90°. The baseband signals are independently amplified and demodulated in a common demodulator which provides a single output signal.

1 Claim, 2 Drawing Sheets

RECEIVER FOR MOBILE COMMUNICATION SYSTEMS

BACKGROUND OF THE INVENTION

The present invention relates to a receiver suitable for use in mobile communication systems.

Most of the receivers currently employed in mobile communication systems are based on the so-called superheterodyne system, which converts the frequency of a received signal into an intermediate frequency (IF). This is because it uses a high frequency band with a narrow channel spacing and permits comparatively easy realization of a detecting circuit. In an especially high frequency band, there is used the double superheterodyne systems, in which frequency conversion is performed twice. However, a receiver using the double superheterodyne system, as will be explained below, is subject to stringent performance requirements on the filter for suppression of image frequency signals and channel selection, and therefore tends to be very expensive.

One solution to this problem, is the direct conversion system described in the UK Patent No. 1,530,602 published in Nov. 1, 1978. This system, however, involves the problem of suppressing spurious radiation of local oscillator signals of the quadrature detector from the input antenna. This is because the setting of the frequency of the local oscillator signal must be substantially equal to that of received signals.

SUMMARY OF THE INVENTION

An object of the present invention, therefore, is to provide a receiver which requires no such stringent filter performance as referred to above and can prevent spurious radiation of local oscillator signals from the antenna.

According to the invention, there is provided a receiver comprising means for receiving a modulated signal; first filter means for band-limiting said received signal; frequency converter means for converting the output signal of said first filter means into an intermediate frequency (IF) signal; detector means for quadrature-detecting said IF signal with a local oscillator signal whose frequency is substantially equal to the center frequency of said IF signal and thereby providing two baseband signals; second filter means for band-limiting each of said two baseband signals; and demodulator means for demodulating the output signal of said second filter means into the original signal.

BRIEF DESCRIPTION OF THE DRAWINGS

The above and other objects, features and advantages of the present invention will become apparent from the following detailed description when taken with the accompanying drawings in which.

DESCRIPTION OF THE PREFERRED EMBODIMENT

Figure 1:
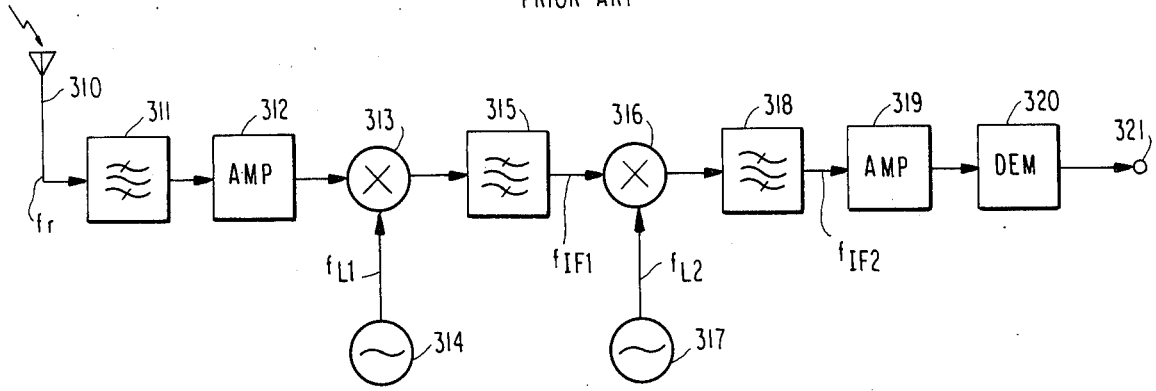
FIG. 1 is a block diagram illustrating a receiver by the prior art.

First to facilitate understanding of the present invention, a receiver in the prior art using the double superheterodyne system will be described with reference to FIG. 1. Referring to the figure, a modulated signal of a frequency $f_r$ received by an antenna 310 is band-limited by a first band-pass filter (BPF) 311 and amplified by a high frequency amplifier 312 (this high frequency amplifier may be dispensed with). The amplified signal is frequency-converted into a first IF signal $f_{IF1}=(f_r-f_{L1})$ by a mixer (multiplier) 313, using a local oscillator signal of a frequency $f_{L1}$ from a first local oscillator 314. Since the input signals $f_{L1}+f_{IF1}$ has an image frequency of $f_{L1}-f_{IF1}$ with respect to the frequency $f_{L1}$, both the frequency components $f_{L1}+f_{IF1}$ and $f_{L1}-f_{IF1}$ fall at the same IF frequency by frequency-conversion in the mixer. Therefore, the receiver may also receive a signal of the image frequency $f_{L1}-f_{IF1}$ besides the desired signal of the frequency $f_{L1}+f_{IF1}$. To solve this problem, the relationship among the attenuation characteristic of the first BPF 311, the local oscillator frequency $f_{L1}$ and the IF $f_{IF1}$ has to be so selected, as shown in FIG. 2, that the first BPF 311 can sufficiently suppress the signal of the image frequency $f_{L1}-f_{IF1}$.

The signal of the first IF $f_{IF1}$, after being similarly band-limited by a second BPF 315, is frequency-converted into a second IF signal of frequency $f_{IF2}=(f_{IF1}-f_{L2})$ by a mixer (multiplier) 316, using the output signal of a frequency $f_{L2}$ from a second local oscillator 317. Here again, the problem of an image frequency signal of a frequency $f_{IF1}-f_{L2}$ requires that the relationship among the attenuation characteristic of the BPF 315, the second local oscillator frequency $f_{L2}$ and the second IF $f_{IF2}$ have to be so selected, as shown in FIG. 2, that the second BPF 315 can sufficiently suppress the signal of the image frequency $(f_{L2}-f_{IF2})$. The signal of the second IF, after being band-limited by a channel filter 318, is supplied through an amplifier 319 to a demodulator 320, by which it is demodulated to give a received signal at an output terminal 321. The specific methods of modulation and demodulation are not described herein because they have no direct relevance to the present invention and the receiver shown in FIG. 1 can apply to frequency modulation, phase modulation or other modulation.

The choice of the first and second IF's ($f_{IF1}$ and $f_{IF2}$) is determined in coordination with the attenuation characteristics of the BPF's 311 and 315. For receiving a modulated signal in a 900 MHz band of 25 KHz channel spacings for instance, the following frequencies are selected.

Input signal frequency $f_r$: 900 MHz
First intermediate frequency $f_{IF1}$: 90 MHz
(First local oscillator frequency $f_{L1}$: 810 MHz)
Second intermediate frequency $f_{IF2}$: 455 KHz
(Second local oscillator frequency $f_{L2}$: 89.544 MHz)

Such a receiver, as stated above, requires a channel filter 318 which has a steep attenuation characteristic and accordingly is expensive.

Figure 3:
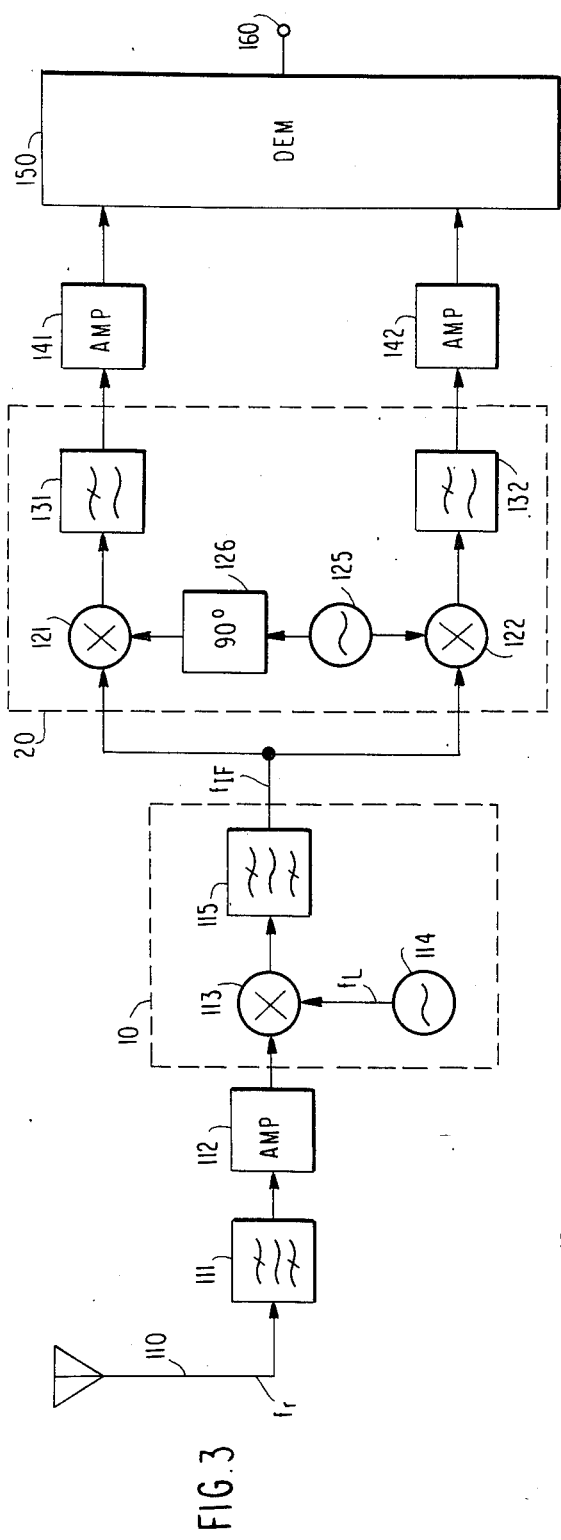
FIG. 3 is a block diagram illustrating a preferred embodiment of the present invention.

Referring now to FIG. 3, a receiver according to the present invention is provided with a band-pass filter 111 for band-limiting an input signal entered from an antenna 110, a high frequency amplifier 112 for amplifying the band-limited signal, a frequency converter 10 for converting the amplified signal into an IF signal, a quadrature detector 20 for quadrature-detecting the IF signal, amplifiers 141 and 142 for respectively amplifying two baseband signals whose detected phases differ by 90 degrees from each other, and a demodulator 150 for demodulating the amplified baseband signals. The frequency converter 10 consists of a local oscillator 114, a mixer 113 for mixing the output of the high frequency amplifier 112 with the output of the local oscillator 114, and a band-pass filter 115 for suppressing unnecessary signal components of the mixer output.

Meanwhile, the quadrature detector 20 comprises a local oscillator 125, a 90-degree phase shifter 126, and mixers 121 and 122. The quadrature detector 20, since a similar detector is illustrated in FIG. 1 of the above-cited UK Patent, will be no further described here. Low-pass filters 131 and 132 of the quadrature detector 20, used for taking out baseband signals alone, can also serve as channel filters.

In a receiver shown in FIG. 3, a received signal entered from the antenna 110, after being band-limited by the BPF 111 and amplified by the high frequency amplifier 112, is frequency-mixed by the mixer 113, using the output signal $f_L$ of the local oscillator 114. By supplying the output to a BPF 115, there is provided an IF signal of a frequency $f_{IF}$. The IF signal is detected by the quadrature detector 20, which has a local oscillator signal whose frequency $f'_L$ is substantially equal to the center frequency of the IF signal, to give first and second baseband signals whose phases differ by 90 degrees from each other. These baseband signals are amplified by the amplifiers 141 and 142, respectively, and entered into the demodulator 150 for demodulation to give the received signal at an output terminal 160. Channel selection can be achieved by varying the oscillation frequency $f_L$ of the local oscillator 114.

Figure 2:
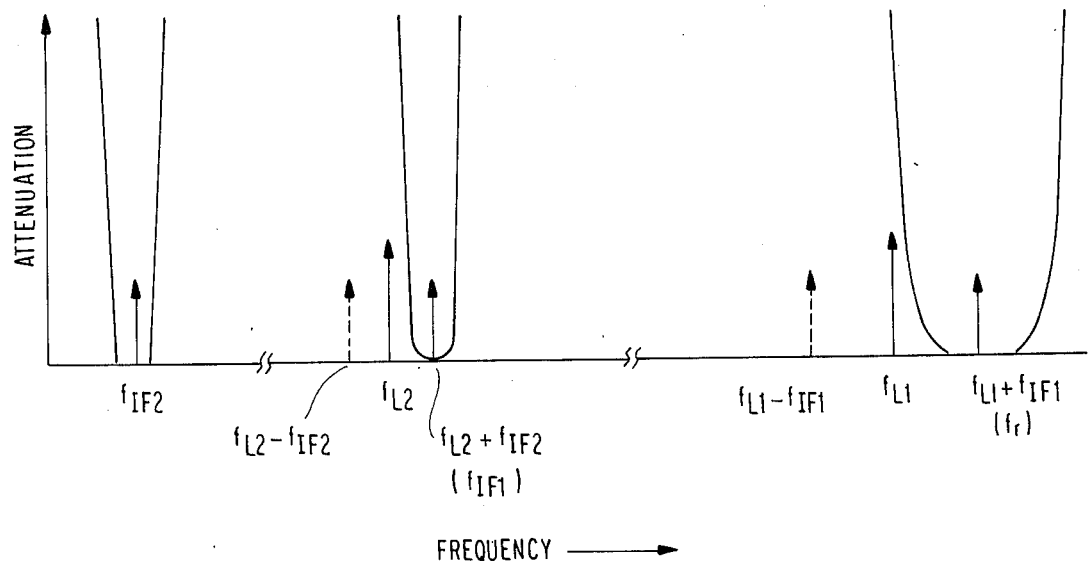
FIG. 2 is a diagram for explaining the problem posed by an image frequency.

Even in this preferred embodiment, like in the conventional receiver illustrated in FIG. 1, the characteristic of the band-pass filter 111 has to be so set as to be insensitive to the image frequency. However, since the quadrature detector 20 directly converts the input signal therein into the baseband signal, the receiver does not need further frequency conversion with frequency $f_{IF2}$. As a result, the present invention removes frequency restriction on the IF's, as required in the circuit of FIG. 1, and allows to choose the IF $f_{IF}$ freely. This leads to the filter characteristic of the BPF 111 being much less stringent than that on the comparable filter of the conventional receiver.

Figure 4:
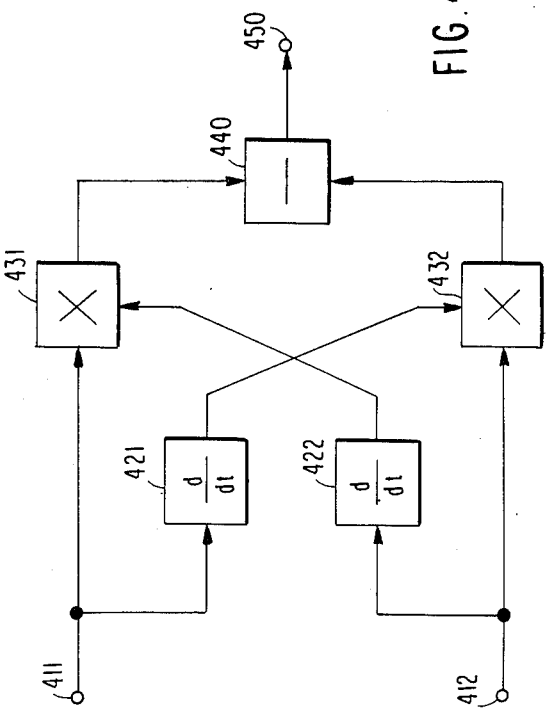
FIG. 4 is a block diagram illustrating an example of demodulator for use in the receiver shown in FIG. 3.

FIG. 4 shows a demodulator for frequency modulated signals as an example of the demodulator 150. The demodulator 150 comprises differentiators 421 and 422, multipliers 431 and 432 cross-connected to these differentiators, and a subtractor 440. As the first and second baseband signals from the amplifiers 141 and 142, respectively, are supplied to input terminals 411 and 412 of this demodulator 150, the first baseband signal is multiplied, in the multiplier 431, with a signal obtained by the differentiation of the second baseband signal and the second baseband signal is multiplied, in the multiplier 432, with a signal which is a differentiation of the first baseband signal. The multiplied outputs are entered into the subtractor 440 to give a demodulated signal at an output terminal 450. The operation of this demodulator, since it is disclosed in the specification of the above-cited UK Patent, will be no further described here. It is should be noted that a demodulator for phase or amplitude modulated signals may be used in place of the demodulator for frequency modulated signals.

As stated above, since this preferred embodiment significantly suppresses the local oscillator signal from the quadrature detector 20 with the BPF 111, no spurious electromagnetic wave is radiated from the antenna 110. The application of the invention is not limited to this preferred embodiment, but many other variations and alterations are of course possible within the scope of the invention.

What is claimed is:

1. A receiver for mobile communication systems comprising: means for receiving a signal modulated by an original signal; first filter means for band-limiting said received signal; a frequency converter means having a single stage, including a frequency mixer and a band-pass filter, for converting the output signal of said first filter means into an intermediate frequency signal; detector means for quadrature-detecting said intermediate frequency signal with a local oscillator signal whose frequency is substantially equal to the center frequency of said intermediate frequency signal and thereby providing two baseband signals; first and second channel filter means for band-limiting each of said two baseband signals; and demodulator means for demodulating the output signals of said first and second channel filter means into said original signal.

* * * * *